(12) United States Patent
Cheng et al.

(10) Patent No.: US 6,943,550 B2
(45) Date of Patent: Sep. 13, 2005

(54) HIGH TEMPERATURE SUPERCONDUCTOR TAPE RF COIL FOR MAGNETIC RESONANCE IMAGING

(75) Inventors: Frederick M.C. Cheng, Fanling (CN); Francis K.H. Lee, Aberdeen (CN); Edward S. Yang, Menlo Park, CA (US)

(73) Assignee: The University of Hong Kong, Hong Kong (CN)

( * ) Notice: Subject to any disclaimer, the term of this patent is extended or adjusted under 35 U.S.C. 154(b) by 225 days.

(21) Appl. No.: 10/435,578

(22) Filed: May 9, 2003

(65) Prior Publication Data

US 2004/0222186 A1 Nov. 11, 2004

(51) Int. Cl.$^7$ ................................................ G01V 3/00
(52) U.S. Cl. ...................................... 324/318; 324/322
(58) Field of Search ............................... 324/318, 322, 324/319, 309, 307; 600/410

(56) References Cited

U.S. PATENT DOCUMENTS

| | | | | |
|---|---|---|---|---|
| 5,565,778 A | * | 10/1996 | Brey et al. ................... | 324/318 |
| 5,585,723 A | * | 12/1996 | Withers ....................... | 324/318 |
| 5,882,536 A | | 3/1999 | Balachandran et al. ..... | 324/318 |
| 6,054,855 A | * | 4/2000 | Anderson .................... | 324/318 |
| 6,169,399 B1 | * | 1/2001 | Zhang et al. ................ | 324/318 |
| 6,201,392 B1 | * | 3/2001 | Anderson et al. ........... | 324/300 |
| 6,556,013 B2 | * | 4/2003 | Withers ....................... | 324/322 |

OTHER PUBLICATIONS

Black et al., entitled "A High–Temperature Superconducting Receiver for Nuclear Magnetic Resonance Microscopy", Science, vol.:259:793 (1993).

Howard D. W. Hill, entitled "Improved Sensitivity of NMR Spectroscopy Probes by Use of High–Temperature Superconductive Detection Coils", IEEE Transactions on Applied Superconductivity, vol. 7:2 (1997).

Okada et al., entitled "RF Coil for Low–Field MRI Coated with High–Temperature Superconductor", J. Magnetic Resonance, Series B:107:158–164 (1995).

Black et al., entitled "Performance of a High–Temperature Superconducting Resonator for High–Field Imaging", J. Magnetic Resonance, Series B:113, 74–80 (1995).

Fang et al., entitled "Design of Superconducting MRI Surface Coil by Using Method of Moment", IEEE Transactions on Applied Superconductivity, vol. 12:2 1823—1827 (2002).

Ma et al., entitled "Superconducting MR Surface Coils for Human Imaging", tear sheet.

* cited by examiner

Primary Examiner—Brij B. Shrivastav
(74) Attorney, Agent, or Firm—Dickstein, Shapiro, Morin & Oshinsky, LLP.

(57) ABSTRACT

A HTS RF coil is disclosed having at least a factor of three improvement in the SNR over a comparable copper coil and at least a factor of six improvement in Q over a comparable copper coil. A commercially available HTS tape is formed into a loop. High-Q capacitors are soldered across the loop ends. The silver sheath covering the tape is removed through chemical etching. The coil is placed in a holder for mechanical support and protection and covered with a cover having through holes enabling the coolant to directly contact the HTS coil.

19 Claims, 5 Drawing Sheets

HIGH TEMPERATURE SUPERCONDUCTOR TAPE RF COIL FOR MAGNETIC RESONANCE IMAGING

BACKGROUND OF THE INVENTION

1. Field of the Invention

The present invention relates to RF receiving coils for magnetic resonance imaging (MRI). More specifically, the invention relates to RF receiving coils incorporating high temperature superconductor (HTS) tapes.

2. Description of the Related Art

The receiver coil in an MRI device receives the signal emitted from the sample that is later converted into a 2-D image or 3-D model of the sample. The receiver coil usually sits inside the magnet and the gradient coils of the MRI device. Receiver coils are normally made of copper wire windings that exhibit a substantial resistance relative to the electrical resistance of the superconductor coils of the magnet or the gradient coils. It is believed that receiver coils employing superconductor materials would result in a higher Quality-factor and better MRI quality.

Receiver coils made of HTS thin films have been fabricated and shown to exhibit a higher quality factor. Ma et al., "Superconducting MR Surface Coils for Human Imaging," *Proc. Mag. Res. Medicine,* 1, 171 (1999), herein incorporated by reference, describes a surface receiving coil incorporating HTS thin film. The rigid substrate of the wafer supporting the HTS thin film, however, limits the geometry of the receiving coil to a surface coil configuration.

Hill, "Improved sensitivity of NMR spectroscopy probes by use of high-temperature superconductive detection coils," IEEE Transactions on Applied Superconductivity, Vol. 7, No. 2 (1977), herein incorporated by reference, describes a detection coil incorporating HTS thin film and reported that the increase in quality factor was partially offset by the lower filling factor of the thin film coil.

The restrictions caused by the rigid HTS film substrate further limits the ability to handle a variety of imaging situations that frequently arise. It is not uncommon to use a variety of coil configurations depending on the sample and the desired information from the MRI scan. For example, a birdcage coil is preferred for imaging the head and brain whereas a single turn coil may be more appropriate for an extremities such as the breasts and the wrist. Furthermore, manufacture of HTS thin films usually require semiconductor-manufacturing techniques that increase the cost of the coil and are limited by the maximum wafer size that the process equipment can handle.

Therefore, there remains a need for a receiver coil having a large quality factor with sufficient flexibility to form the various receiver coil configurations used in present day MRI practice that can be manufactured at low cost.

SUMMARY OF THE INVENTION

One embodiment of the present invention is directed to an HTS RF coil for an MRI device having a sample chamber, the HTS RF coil comprising: a coil holder sized to fit around the sample chamber; and an HTS coil supported by the coil holder and enclosing the sample chamber.

Another embodiment of the present invention is directed to an HTS RF coil for an MRI device having a sample chamber, the HTS RF coil comprising: a coil holder sized to fit around the sample chamber; an HTS tape having a first end and a second end and a surface comprised essentially of high temperature superconductor, the HTS tape supported by the coil holder and enclosing the sample chamber; and a high-Q capacitor having a first contact and a second contact, the first end of the HTS tape in electrical contact with the first contact and the second end of the HTS tape in electrical contact with the second contact.

Another embodiment of the present invention is directed to a method of manufacturing an HTS RF coil for an MRI device having a sample chamber, the method comprising: providing an HTS wire having a first end and a second end; attaching a high-Q capacitor to the first and second end of the HTS wire; removing substantially all electrically conductive material covering the HTS wire; and mounting the HTS wire in a coil holder, the coil holder providing mechanical support to the HTS wire.

BRIEF DESCRIPTION OF THE DRAWINGS

The invention will be described by reference to the preferred and alternative embodiments thereof in conjunction with the drawings in which.

DETAILED DESCRIPTION

Figure 1:
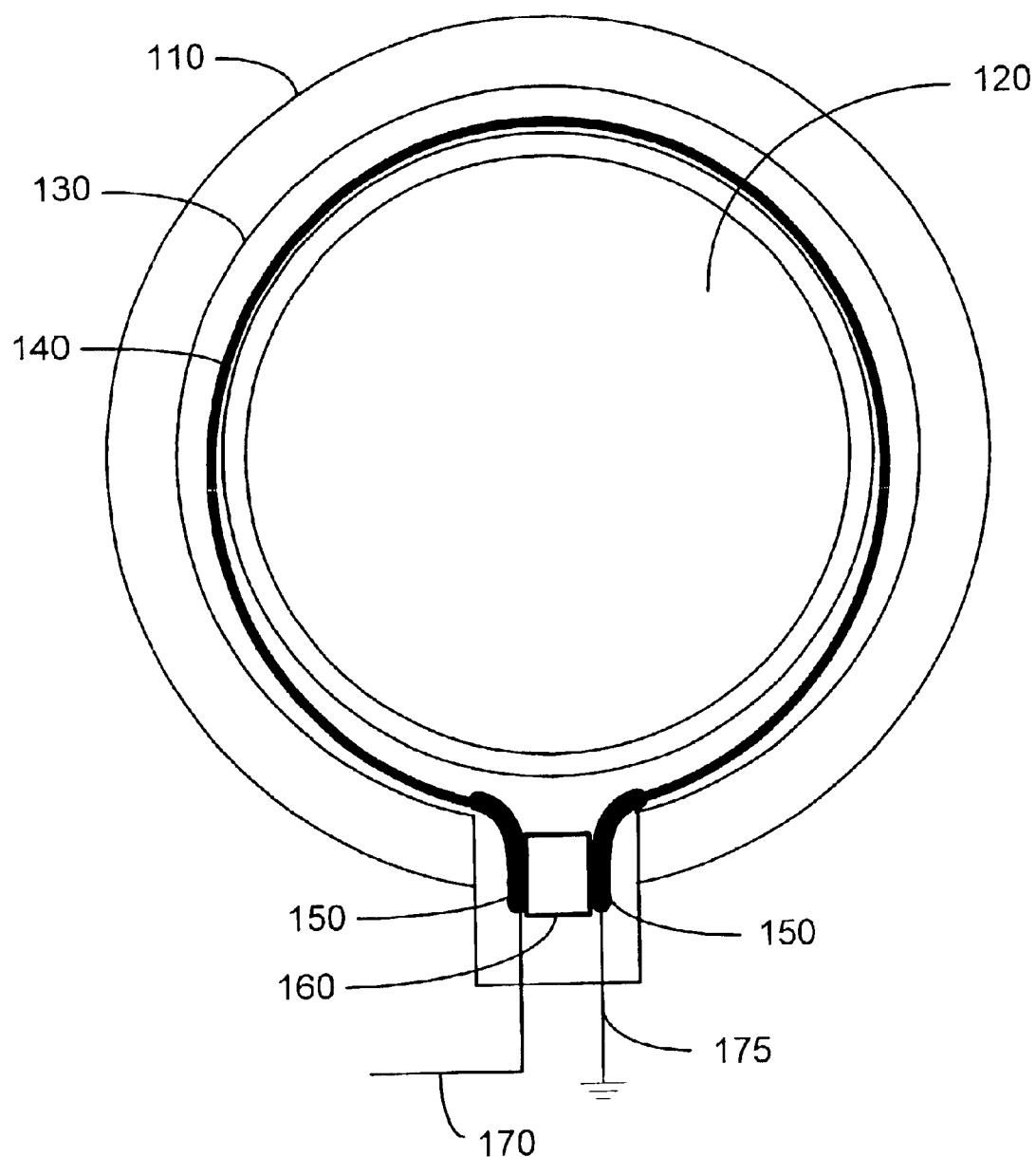
FIG. 1 is an illustration of one embodiment of the present invention.

FIG. 1 is an illustration of one embodiment of the present invention. In the embodiment shown in FIG. 1, the coil holder 110 is an annular ring enclosing a test volume 120. The coil holder 110 has a circumferential groove 130 extending around the circumference of the coil holder 110. The superconducting coil 140 is disposed in the circumferential groove 130 and is supported by the coil holder. The superconducting coil 140 is formed as a loop having metal contacts 150 at each loop end. The metal contact 150 allows the ends of the loop to be soldered to a loop capacitor 160 and to a ground lead 175 and a signal processing lead 170.

Figure 2:
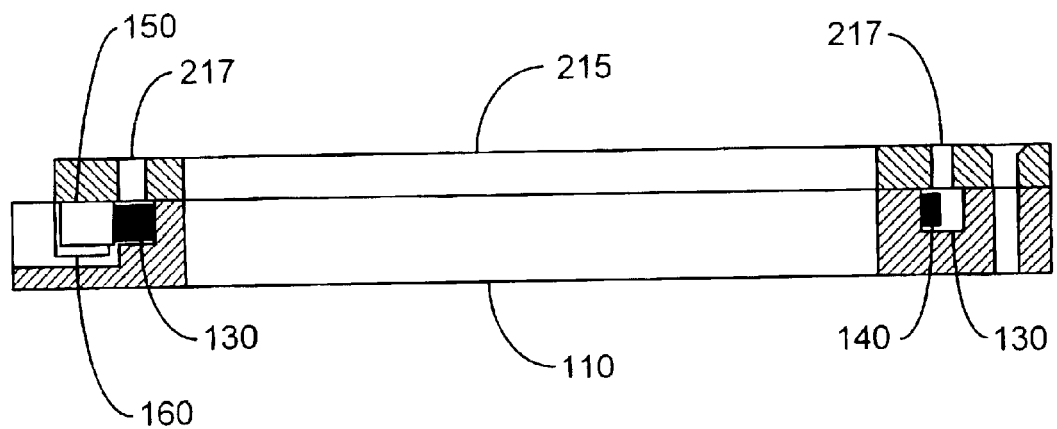
FIG. 2 is a side section view of the embodiment shown in FIG. 1.

FIG. 2 is a side section view of the embodiment shown in FIG. 1. Superconducting coil 140 is disposed in the circumferential groove 130 of the coil holder 110. A holder cover 215 covers the circumferential groove 130 to retain the superconducting coil 140 within the groove 130. Through holes 217 in the cover 215 allow direct contact of the coolant with the superconductor coil 140. Optional through holes extending from the bottom of the groove 130 to the back surface of the coil holder 110 may be spaced along the circumference of the ring to allow direct contact of the coolant to the superconducting coil 140. The coolant may be any substance capable of keeping the temperature of the superconductor coil 140 below the superconductivity onset temperature of the coil. For example, liquid helium may be used as the coolant and in the preferred embodiment, liquid nitrogen may be used as the coolant.

The cover 215 may be permanently attached to the coil holder 110 or may be removably fastened to the holder 110 using, for example, screws or latches or other such mechanisms and devices known to one of skill in the art.

The holder 110 and cover 215 are preferably made of a material that can withstand the cryogenic environment of the RF coil retaining sufficient strength to provide mechanical support for the RF coil. In some embodiments, a strong thermoplastic such as, for example, acrylic may be used as the holder and cover. The thermoplastic, in some embodiments, is selected to have a low thermal expansion coefficient, high fracture toughness, and resistant to chemical reactions. Thermal cracking may also be reduced by selecting for the holder and cover geometric shapes such as, for example, a ring, which minimizes the occurrence and magnitude of stress concentrators in the holder and ring.

The superconductor coil 140 is composed of a high temperature superconductor (HTS) composition such as, for example, Bi-2223 compound although other HTS compositions may be used. The HTS composition is preferably in wire or tape form. HTS compositions in tape form are available, for example, as HTS wire from American Superconductor of Westborough, Mass. The HTS wire, however, is unsuitable as an RF coil because of the silver alloy sheath covering the surface of the HTS composition. The silver alloy sheath is believed to provide mechanical support of the HTS precursor materials before conversion to the HTS composition and provides mechanical support and abrasion resistance of the converted HTS composition. The silver alloy has a desirable property in that it does not appear to chemically interact with the HTS precursors or HTS compositions nor does it appear to affect the current carrying capacity of the HTS wire. For the intended use of the HTS wire wherein the HTS wire comprises the windings of the main MRI magnet, the HTS wire is adapted to handle the large DC currents that create the large and static magnetic field of the main magnet of the MRI device.

The commercially available HTS wire, however, is not suitable for use as an RF coil. RF coils for current MRI devices must be sensitive to the radio frequency signal generated in the sample during an MRI scan. The radio frequency generated in the sample during an MRI scan is in the 5–1000 MHz range and depends on the magnetic field strength and on the specific isotope used to form the image. In the expected range of signal frequencies, the induced current in the receiver coil is confined to the outer surface of the coil. If the coil is covered with a conductor such as silver alloy, the induced currents will be confined to the silver alloy, thereby eliminating any advantage of having a superconducting core.

Removal of the silver alloy sheath from the superconducting core must be done before the HTS wire can be used as an RF coil. In a preferred embodiment, removal of the silver alloy sheath is accomplished by chemical etching. Other removal methods may be used under the constraint that the removal method does not damage the relatively weak HTS material. U.S. Pat. No. 5,882,536 issued to Balachandran et al., on Mar. 16, 1999 discloses a method of etching the silver ally sheath from HTS tape and is herein incorporated by reference.

Figure 3:
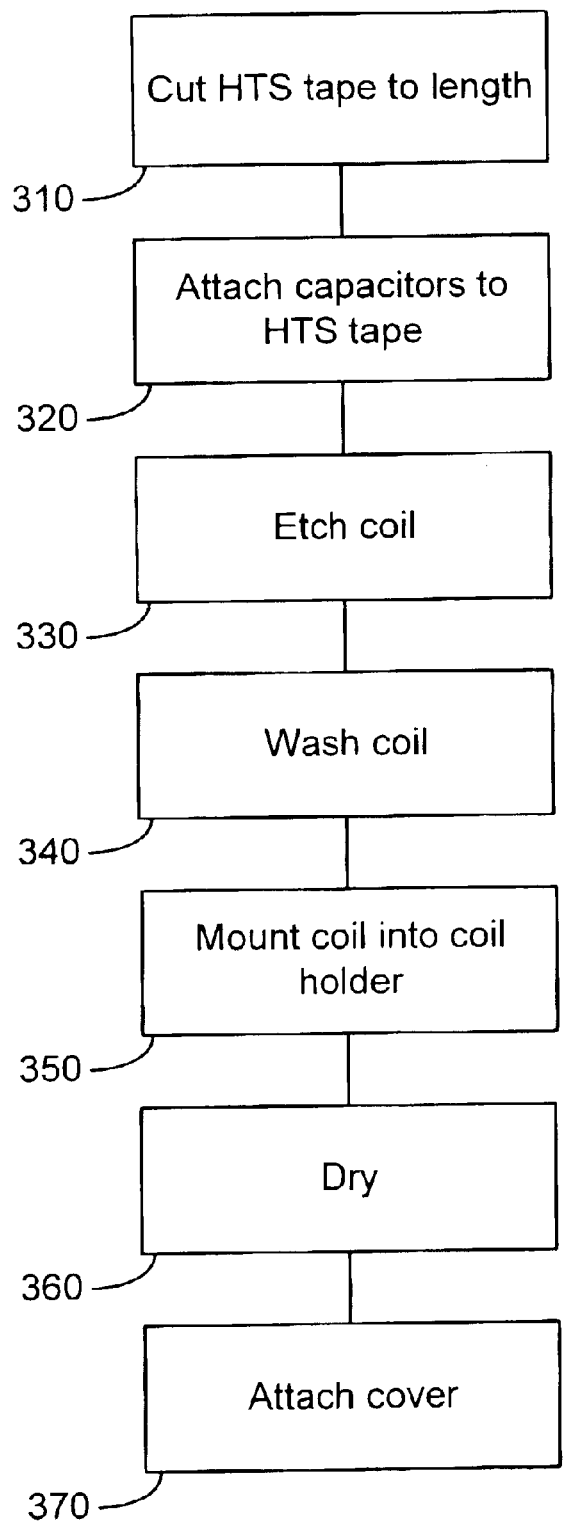
FIG. 3 is a process flow diagram illustrating the fabrication of one embodiment of the present invention.

FIG. 3 is a process flow diagram illustrating the fabrication of one embodiment of the present invention. In step 310, a length of HTS tape sized to fit in the circumferential groove of the coil holder is cut so that the tape is slightly longer than the perimeter of the groove. High-Q capacitors are soldered across the ends of the HTS tape to form the HTS tape coil in step 320. In a preferred embodiment, the solder is a lead/tin composition selected to reduce the occurrence of thermal cracking at the contact. The capacitors are selected such that the LC circuit of the coil has a resonant frequency close to the expected signal frequency of the sample.

The HTS tape coil is etched in step 330 until the removal of the silver sheath is substantially complete and the bare HTS tape is exposed. Only portions of the sheath at the ends of the loop are retained. In some embodiments, the etching solution is an aqueous mixture of ammonium hydroxide and hydrogen peroxide.

Prior to immersion in the etching solution, the surface of the silver sheath is mechanically abraded using fine sandpaper. The etching solution is prepared comprising 30–45% ammonium hydroxide, 30–45% hydrogen peroxide, and deionized water making up the balance of the solution. In a preferred embodiment, the etching solution comprises 40% ammonium hydroxide, 40% hydrogen peroxide, and 20% deionized water. After the light mechanical abrasion, the HTS tape coil is immersed in the etching solution until the silver sheath is removed. The removal of the sheath may be monitored visually as the whitish sheath layer is etched away to reveal the darker surface of the high temperature superconductor.

After the silver sheath has been removed, the coil is washed to remove residual etching solution from the coil in step 340. The coil is carefully transferred to a deionized water bath and gently washed before being placed in the holder. The coil, now supported by the holder is removed from the water bath and air-dried in 360. The cover is attached to the holder and holds the coil within the groove of the holder.

Figure 4:
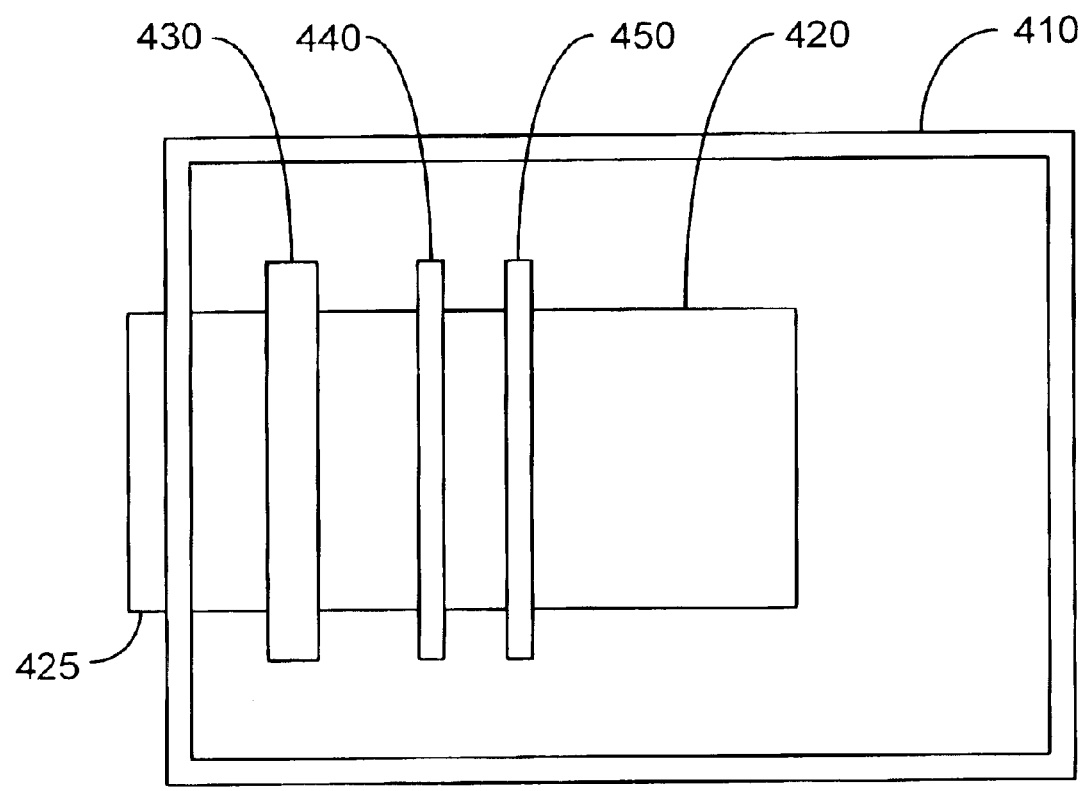
FIG. 4 is a schematic diagram illustrating the use of the HTS RF coil for an MRI scan.

FIG. 4 is a schematic diagram illustrating the use of the HTS RF coil for an MRI scan. A sample chamber 420 is immersed in liquid nitrogen contained in a cryostat 410. The sample chamber 420 isolates a sample placed in the chamber from the liquid nitrogen contained by the cryostat 410. The HTS RF coil fits over the outer surface of the sample chamber 420 and is immersed in the liquid nitrogen. Through holes through the cover, and optionally through the back of the holder, enable direct contact of the HTS with the liquid nitrogen, thereby maintaining the HTS tape in a superconducting state. A pickup loop 440 and tuning ring 450 also fit over the outer surface of the sample chamber 420 and may be moved along the outer surface of the sample chamber. The pickup loop 440 detects the signal from the HTS RF coil 430 and the tuning ring 450 is used to couple inductance into the HTS RF coil 430 for fine frequency tuning. Although not shown, the main magnet may be positioned such that the HTS RF coil 430 is in the gap between the two poles of the main magnet or such that the HTS RF coil 430 is inside the circular bore of a cylindrical main magnet. The gradient magnet, also not shown, may be embedded in the main magnet or placed in close proximity to the main magnet. The HTS RF coil 430, pickup loop 440, and tuning ring 450 are connected to the appropriate imaging and control hardware as would be known to one of skill in the art and is not further discussed.

A sample is placed in the sample chamber 420 through a chamber port 415 and an MRI scan of the sample with a conventional Spin Echo pulse sequence was completed following procedures familiar to one of skill in the art. A comparison of the quality factor of the HTS RF coil at 77K and a copper coil at 300K is presented in the table 1 below.

TABLE 1

| | Q at magnet iso-center | | | SNR |
| --- | --- | --- | --- | --- |
| | Unloaded | phantom | wrist | phantom |
| Cu (300K) | 130 | 128 | 128 | 40 |
| HTS (77K) | 866 | 788 | 780 | 122 |

In the table above, Q is estimated by calculating the ratio of the frequency of the coil to the bandwidth of the coil at the magnet iso-center. Q is measured for an empty sample chamber (unloaded), a uniform blank sample (phantom), and a human wrist. The table indicates that the HTS RF coil exhibits a higher Q over the copper coil by at least a factor of six. Similarly, the HTS RF coil exhibits a higher signal-to-noise ratio (SNR) over the copper coil by at least a factor of three. The SNR values in Table 1 are of images taken in a 0.21T MRI system.

Figure 5A:
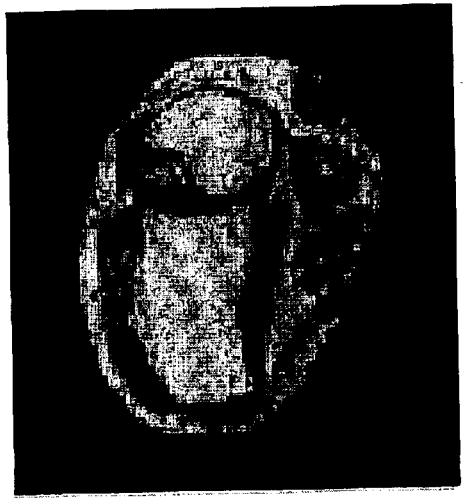
FIG. 5a presents an MRI scan of the axial view of a human wrist using the HTS coil in the configuration illustrated in FIG. 4.
Figure 5B:
FIG. 5b presents the coronal view of a human wrist using the HTS coil in the configuration shown in FIG. 4.
Figure 5C:
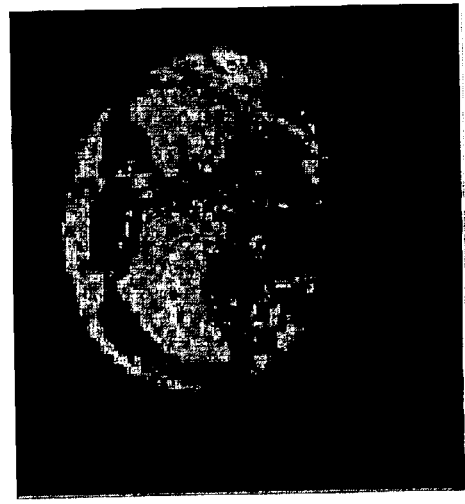
FIG. 5c presents the axial view of a human wrist using a copper coil.
Figure 5D:
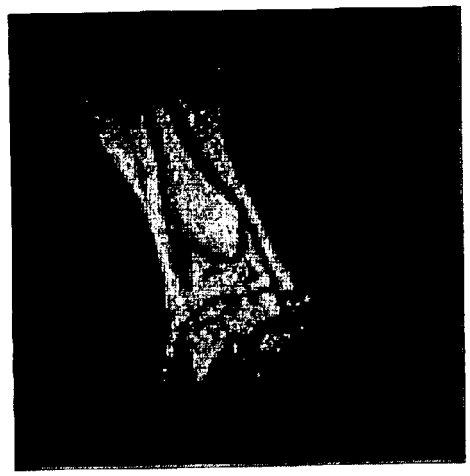
FIG. 5d presents the coronal view of a human wrist using a copper coil.

FIG. 5a presents an MRI scan of the axial view of a human wrist using the HTS coil in the configuration illustrated in FIG. 4. FIG. 5b presents the coronal view of a human wrist using the HTS coil in the configuration shown in FIG. 4. FIG. 5c presents the axial view of a human wrist using a copper coil and FIG. 5d presents the coronal view of a human wrist using a copper coil. Comparisons of the images indicate that the HTS RF coil produce higher quality and more distinct images than the copper coil.

Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed:

1. An HTS RF coil for an MRI device having a sample chamber, the HTS RF coil comprising:
    a coil holder sized to fit around the sample chamber;
    an HTS tape having a first end and a second end and a surface comprised essentially of high temperature superconductor, the HTS tape supported by the coil holder and enclosing the sample chamber; and
    a high-Q capacitor having a first contact and a second contact, the first end of the HTS tape in electrical contact with the first contact and the second end of the HTS tape in electrical contact with the second contact.

2. The HTS RF coil of claim 1 wherein the coil holder is a ring having an inner diameter sized to fit around the sample chamber.

3. The HTS RF coil of claim 1 wherein the coil holder further comprises a groove sized to receive the HTS tape.

4. The HTS RF coil of claim 3 further comprising a cover attached to the holder, the cover retaining the HTS tape within the groove of the holder.

5. The HTS RF coil of claim 4 wherein the cover comprises at least one through hole positioned over the groove, the at least one through hole allowing direct contact between a coolant and the HTS tape.

6. The HTS RF coil of claim 5 wherein the coolant is liquid nitrogen.

7. The HTS RF coil of claim 1 further comprising a pick-up loop.

8. The HTS RF coil of claim 7 further comprising a tuning ring.

9. A method of constructing an HTS RF coil for an MRI device having a sample chamber, the method comprising:
    providing an HTS tape having a first end and a second end, said HTS tape comprising a high temperature superconductor; attaching a high-Q capacitor to the first and second end of the HTS tape; removing substantially all material sheathing the HTS tape; and mounting the HTS tape in a coil holder, the coil holder providing mechanical support to the HTS tape.

10. The method of claim 9 wherein the sheathing material is a silver alloy.

11. The method of claim 10 wherein the sheathing material is removed by contacting the sheathing material with an etching solution.

12. The method of claim 11 wherein the etching solution is an aqueous solution of ammonium hydroxide and hydrogen peroxide.

13. The method of claim 11 wherein the etching solution contains between 30% and 45% ammonium hydroxide.

14. The method of claim 11 wherein the etching solution contains between 30% and 45% hydrogen peroxide.

15. The method of claim of claim 7 wherein the step of removing further includes mechanically abrading the material sheathing the HTS tape.

16. An HTS RF coil for use in an MRI device having a sample chamber, the HTS RF coil comprising: an HTS tape member adapted to surround the sample chamber and be supported thereon, said HTS tape member comprising a high temperature superconductor; and a high-Q capacitor being connected in parallel with the HTS tape member.

17. The HTS RF coil of claim 16, wherein the surface of the HTS tape member comprises a high temperature superconductor.

18. The HTS RF coil of claim 16 further comprising: a tuning coil enclosing the sample chamber; and a pick-up loop enclosing the sample chamber.

19. An MRI device having a sample chamber and comprising an HTS RT coil, wherein the HTS RT coil comprises: an HTS tape member surrounding the sample chamber and supported thereon, said HTS tape member comprising a high temperature superconductor; and a high-Q capacitor being connected in parallel with the HTS tape member.

* * * * *